(12) United States Patent
Yoneda

(10) Patent No.: US 6,667,491 B2
(45) Date of Patent: Dec. 23, 2003

(54) SEMICONDUCTOR DEVICE

(75) Inventor: Yoshikazu Yoneda, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/142,159

(22) Filed: May 10, 2002

(65) Prior Publication Data

US 2003/0116823 A1 Jun. 26, 2003

(30) Foreign Application Priority Data

Dec. 21, 2001 (JP) ........................................ 2001-388775

(51) Int. Cl.[7] .............................................. H01L 29/06
(52) U.S. Cl. ........................................ 257/19; 257/577
(58) Field of Search ................................. 257/275, 280, 257/298, 300, 197, 198, 199, 204, 296, 302, 577, 19, 12, 16, 17, 22

(56) References Cited

U.S. PATENT DOCUMENTS 5,268,315 A * 12/1993 Prasad et al. ............ 257/197 X

FOREIGN PATENT DOCUMENTS

JP 11-307645 11/1999

OTHER PUBLICATIONS

Matsumoto et al., A New High–performance lateral insulated gate bipolar transistor form Quasi–SOI, IEEE, 1995, vol 16 issue 9, pp. 402–404.*

Cressler, "SiGe HBT Technology: A New Contender For Si–Based RF And Microwave Circuit Applications", IEEE Transactions on Microwave Theory and Techniques, vol. 46, No. 5, May 1998, pp. 572–587.

Nakashima et al., "0.8μm BiCMOS Process With Resistivity Substrate For L–Band Si–MMIC Applications", IEEE BCTM 8.3, 1995, pp. 134–137.

Burghartz et al., "RF Components In An Analog SiGe Bipolar Technology", IEEE BCTM 8.4, 1996, pp. 138–141.

"High Performance BiCMOS Process Integration: Trends, Issues, And Future Directions", IEEE BCTM 2.1, 1997, pp. 36–43.

Muraguchi, "RF Device Trends For Wireless Applications", Extended Abstracts of the 1998 International Conference on Solid State Devices and Materials, Hiroshima, 1998, pp. 76–77.

* cited by examiner

Primary Examiner—Wael Fahmy
Assistant Examiner—Vikki Hoa B. Trinh
(74) Attorney, Agent, or Firm—Leydig, Voit & Mayer, Ltd.

(57) ABSTRACT

A semiconductor device includes a silicon semiconductor substrate, having a main surface including a first region and a second region side-by-side, an epitaxially grown layer of high resistivity as a first layer on the main surface, and an epitaxially grown layer of low resistivity as a second layer on the first layer, and having a resistivity lower than the resistivity of the first layer. The semiconductor device includes a bipolar transistor at the first region and a passive element at the second region. The second layer is covers at least the first region and is absent from at least a portion of the second region.

3 Claims, 18 Drawing Sheets

SEMICONDUCTOR DEVICE

BACKGROUND OF THE INVENTION

1. Field of the Invention

The present invention relates to a semiconductor device including a bipolar transistor, and a method of fabricating such a semiconductor device.

2. Description of the Background Art

A conventional method of fabrication corresponding to formation of a vertical NPN bipolar transistor will be described with reference to FIGS. 16–26. Impurities are implanted from the main surface of a silicon substrate 1 to form a P type layer 52. Then, a P type embedded layer 3 is formed. N type impurities are implanted into P type layer 52. By annealing, an N type embedded layer 2 is formed. As a result, N type embedded layer 2 is completely surrounded by the P type region in silicon substrate 1, as shown in FIG. 16.

Referring to FIG. 17, an epitaxial grown layer 4 of a low resistance such as approximately 0.1 Ω·cm is formed having phosphorus doped all over the main surface of silicon substrate 1. N type embedded layer 2 and P type embedded layer 3 are respectively diffused towards epitaxial grown layer 4, as shown in FIG. 17. A graph of the impurity concentration distribution at the cross section traversing N type embedded layer 2, i.e. the cross section taken along XVIII—XVIII in FIG. 17, is shown in FIG. 18. A region corresponding to epitaxial grown layer 4 and silicon substrate 1 are marked along the vertical axes indicating the depth from the surface. A distribution curve 81 indicates the concentration of phosphorus doped into epitaxial grown layer 4, i.e. the concentration of N type impurities. A distribution curve 82 indicates the concentration of the N type impurities implanted into N type embedded layer 2. Since epitaxial grown layer 4 is initially formed having phosphorus doped, the concentration of the impurity is constant irrespective of the depth, as appreciated from distribution curve 81 of FIG. 18. The reason why distribution curve 81 slightly protrudes into silicon substrate 1 is due to the fact that a portion of the impurities formerly included in epitaxial grown layer 4 diffuses into the under-contacting silicon substrate 1. The N type impurities implanted initially into N type embedded layer 2 diffuse into epitaxial grown layer 4. Thus, distribution curve 82 of FIG. 18 exhibits intrusion towards epitaxial grown layer 4.

A graph of the impurity concentration at a region where there is no impurity layer in FIG. 17, i.e. the cross section along XIX—XIX is shown in FIG. 19. In FIG. 19, only a distribution curve 81 is present since there are only N type impurities, i.e. phosphorous, doped into epitaxial grown layer 4.

Referring to FIG. 20, impurities are implanted to predetermined regions in epitaxial grown layer 4 to form a P type isolation diffusion layer 6 and an N type collector leading layer 7. Then, a field oxide film 5 is formed by LOCOS (local oxidation of silicon). Then, an oxide film 8 is formed at the collector contact region, as shown in FIG. 20.

Referring to FIG. 21, a polysilicon layer is formed all over the surface, followed by ion-implantation of boron of high concentration. Unrequired portions are removed from the polysilicon layer, resulting in an external base 9 by the remaining polysilicon layer. An interlayer oxide film 10 is formed so as to cover the entire surface including external base 9. Etching is effected to form an opening through interlayer oxide film 10 and external base 9 of polysilicon so as to expose epitaxial grown layer 4. This opened portion corresponds to an emitter opening 27. Emitter opening 27 is filled with boron to form an intrinsic base 11, as shown in FIG. 21.

Referring to FIG. 22, an oxide film spacer 12 is formed to electrically insulate and block external base 9. Boron is diffused from external base 9 into epitaxial grown layer 4 by thermal treatment, whereby a P type diffusion layer 13 shown in FIG. 22 is formed.

Referring to FIG. 23, a polysilicon layer is formed so as to cover emitter opening 27. Arsenic is implanted into the polysilicon layer, followed by annealing, whereby arsenic is diffused into intrinsic base 11 to form an N type diffusion layer 14. The unrequired portion of the polysilicon layer is removed. By the remaining portion of the polysilicon layer, an emitter electrode 15 shown in FIG. 23 is formed. Oxide film spacers 16A and 16B are formed so as to cover respective sidewalls of emitter electrode 15 and external base 9, respectively. By forming a CoSi film 17 so as to cover the top surface of external base 9 and N type collector leading layer 7, the parasitic resistance of emitter electrode 15 and external base 9 is reduced.

Referring to FIG. 24, an interlayer insulating film 20 is formed. A contact hole is formed in interlayer insulating film 20. A contact plug 21 is formed by filling the contact hole with a conductor. By connecting the top faces of contact plug 21 with each other through an aluminium line 22, a vertical NPN bipolar transistor of FIG. 24 is provided.

A cross sectional view of a further larger range is shown in FIG. 25. Here, the so-called passive element such as the inductor and capacitor are included here. A polysilicon resistor 18 is included as shown in the cross sectional view of FIG. 25. Polysilicon resistor 18 is adjusted to a desired resistance by controlling the dopant concentration before interlayer insulating film 20 is formed. Polysilicon resistor 18 is also classified as a passive element. An interlayer insulating film 23 is formed above aluminium line 22. In the region where a MIM (Metal Insulator Metal) capacitor 31 is formed, an opening is formed deep into interlayer insulating film 23 so that the top face of aluminium line 22 is exposed. A capacitor dielectric film 24 is formed so as to cover the inner face of that opening and the top plane of interlayer insulating film 23. As shown in FIG. 26, an aluminium line 25 is arranged at the top face of capacitor dielectric film 24 above interlayer insulating film 23. A vertical hole is formed in advance at a predetermined position in interlayer insulating film 23, arriving at aluminium line 22. When aluminium line 25 is formed, these vertical holes are filled with a conductor to establish electrical connection between aluminium line 22 and aluminium line 25. By working on aluminium line 25, the upper electrode of MIM capacitor 31, a spiral inductor 32 and a pad 33 are formed. Then, a nitride film 26 that becomes a protection film is grown thereon. An opening is formed in pad 33. Although not shown, a metal film is formed at the backside of silicon substrate 1.

Although a method of fabricating a vertical NPN bipolar transistor is shown as conventional art, horizontal PNP bipolar transistors and CMOS transistors are often formed on the same chip in addition to the vertical NPN bipolar transistor generally. Furthermore, although only a polysilicon resistor, a MIM capacitor and a spiral inductor are enumerated as passive elements here, other elements such as a MOS capacitor and a Shottky diode are also formed on the same substrate.

Here, a bipolar transistor including only a junction in silicon has been described as a vertical NPN bipolar transistor. Additionally, a hetero junction bipolar transistor employing SiGe for the base (Silicon Germanium-Hetero Bipolar Transistor: SiGe-HBT) shown in FIG. 27 is also known. This type of bipolar transistor has a silicon layer 61, a SiGe layer 62, and a silicon layer 63 layered respectively by epitaxial growth in order on epitaxial grown layer 4. Silicon layer 61 includes phosphorus, and functions as a collector layer. SiGe layer 62 includes boron, and functions as a base layer. Silicon layer 63 includes boron. An external base 64 extends from either side thereof. External base 64 corresponds to the junction between the intrinsic base layer and the base electrode, functioning as a bipolar transistor. External base 64 includes boron in high concentration in order to reduce the resistance. On silicon layer 63 is provided a polysilicon layer 15 including arsenic as the impurity. The diffusion of arsenic from polysilicon layer 15 towards silicon layer 63 causes formation of an N type diffusion layer 14. The combination of N type diffusion layer 14 and polysilicon layer 15 corresponds to an emitter layer. The details are described in "SiGe HBT Technology: A New Contender for Si-Based RF and Microwave Circuit Applications" by John. D. Cressler in IEEE TRANSACTIONS ON MICROWAVE THEORY AND TECHNIQUES, Vol. 46, No. 5, May 1998.

The above conventional application method has problems set forth below. In a device including a vertical bipolar transistor, an epitaxial grown layer of a low resistance such as 0.1–1.0 Ω·cm having N type impurities doped to function as a collector layer is formed all over a silicon substrate to a thickness of approximately 0.6–3.0 μm. Therefore, an epitaxial grown layer of low resistance will also be formed below elements other than the transistor, i.e., under the passive elements.

A structure of the passive element region is shown in the cross sectional view of FIG. 28 in a simplified manner to describe the problem therein. The example of FIG. 28 includes an aluminium line 22, representative of passive elements of various types. An epitaxial grown layer 4 of low resistance is formed on silicon substrate 1. Thereon, a field oxide film 5, and then an interlayer insulating film 20 are formed. Aluminium line 22 is arranged on interlayer insulating film 20. A back electrode 35 is formed at the back side of silicon oxide film 1. A simplified equivalent circuit corresponding to such a structure is shown in FIG. 29. A parasitic capacitance C1 is generated between aluminium line 22 and epitaxial grown layer 4 of low resistance. Such a parasitic capacitance induces a charging and discharging current flow during the operation of the semiconductor device to cause loss therein.

Conventionally, the countermeasure of employing a silicon substrate of high resistance for the semiconductor substrate has been employed to prevent parasitic capacitance between the passive element and the semiconductor substrate. However, the problem of parasitic capacitance between a passive element and an epitaxial grown layer of low resistance could not be solved by just using a silicon substrate of high resistance. To solve this parasitic capacitance, an approach of removing the epitaxial grown layer of low resistance formed under the passive element by etching can be considered. However, this method leaves a distinct step between the region where the epitaxial grown layer is removed and the region where the epitaxial grown layer is not removed. This distinct step causes the problem that the exposure margin is insufficient at the subsequent transfer process. Although this distinct step can be alleviated by providing an oxide film or the like, such an additional process will increase the number of fabrication steps.

SUMMARY OF THE INVENTION

In view of the foregoing, an object of the present invention is to provide a semiconductor device obviating the problem of a distinct step in a transfer process, and absent of parasitic capacitance between the passive element and epitaxial grown layer of low resistance, and a fabrication method of such a semiconductor device.

According to an aspect of the present invention, a semiconductor device includes a semiconductor substrate having a main surface with first and second regions defined in plane, a first layer formed on the main surface, and a second layer formed above the first layer, and having a resistance lower than the resistance of the first layer. The semiconductor device includes a bipolar transistor at the first region, and a passive element at the second region. The second layer is arranged so as to cover at least the first region and avoid at least a portion of the second region. By such a structure, the region below the passive element in the second region is absent of the second layer of low resistance. Therefore, the parasitic capacitance at the region where the passive element is arranged can be reduced. Furthermore, by adjusting the ratio of the thickness of the first layer and the second layer, the stepped portion generated by the absence and presence of the second layer can be reduced.

According to another aspect of the present invention, a method of fabricating a semiconductor device includes the steps of forming an impurity-containing portion at a predetermined region at a main surface of a semiconductor substrate, forming a first layer so as to cover the impurity-containing portion from the upper side by epitaxial growth at a high temperature of at least 900° C., and forming a second layer having a resistance lower than the resistance of the first layer at an upper side of the first layer by epitaxial growth. By employing such a method, impurity diffusion can be directed from the impurity-containing portion to a predetermined region in the first layer during the epitaxial growth of the first layer.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

A method of fabricating a semiconductor device according to a first embodiment of the present invention will be described hereinafter with reference to FIGS. 1–8.

Figure 1:
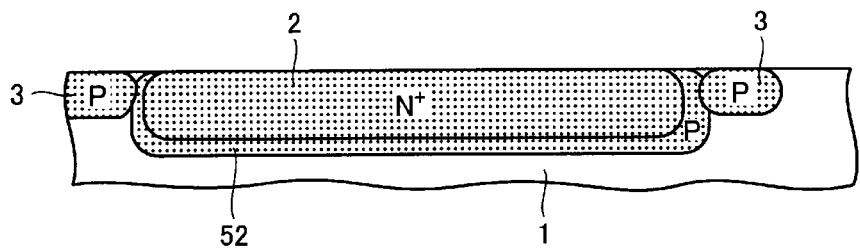
FIG. 1 shows a semiconductor device according to a first embodiment of the present invention to describe a first step of a fabrication method thereof.
Figure 2:
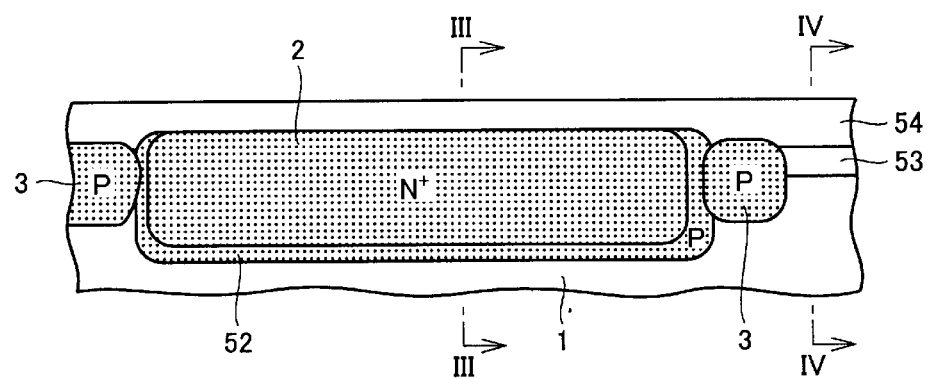
FIG. 2 shows a semiconductor device of the first embodiment to describe a second step of the fabrication method thereof.
Figure 3:
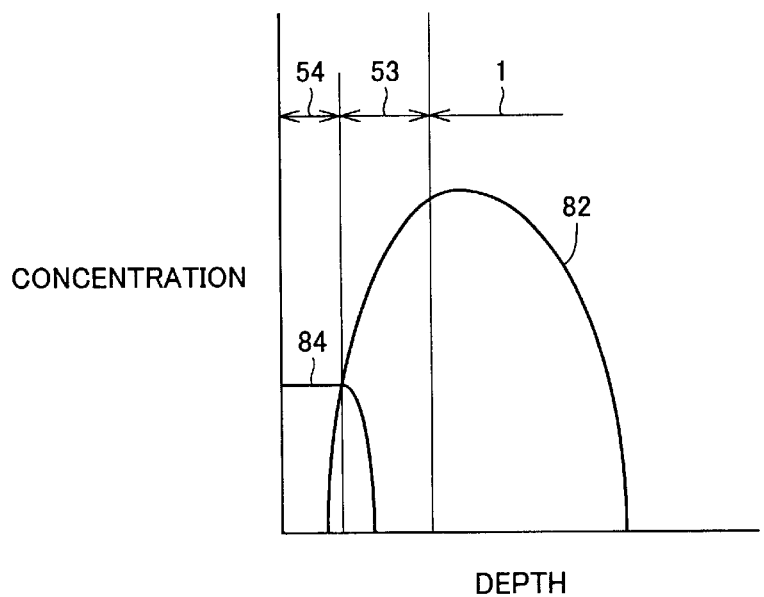
FIGS. 3 and 4 are graphs of an impurity concentration distribution at the cross sections of III—III and IV—IV, respectively, of FIG. 2.
Figure 4:
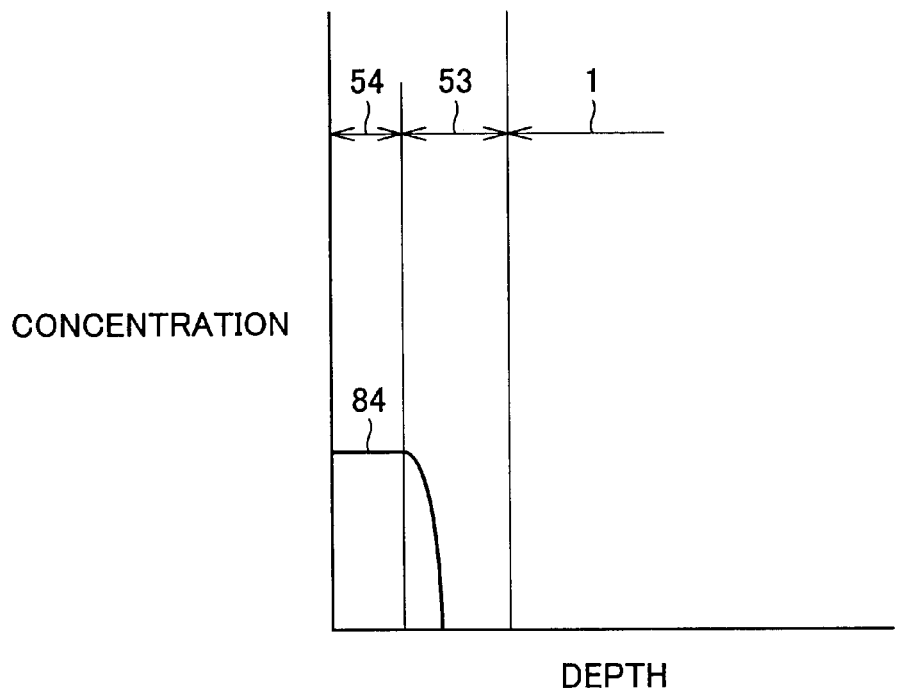

Referring to FIG. 1, impurities are implanted from the main surface of a silicon substrate 1 of high resistance such as 1 k $\Omega$·cm to form a P type layer 52 and a P type embedded layer 3. An N type embedded layer 2 is formed so as to be surrounded by P type layer 52 and P type embedded layer 3. Referring to FIG. 2, an epitaxial grown layer 53 of high resistance such as approximately 100 $\Omega$·cm, undoped with impurities, is formed to a thickness of 0.5 $\mu$m as the first layer. N type impurities are doped thereon to form an epitaxial grown layer 54 of low resistance such as approximately 0.1 $\Omega$·cm to a thickness of 0.3 $\mu$m on epitaxial grown layer 53 of high resistance. FIG. 3 shows a graph of the impurity concentration distribution at the cross section traversing N type embedded layer 2 in FIG. 2, i.e., the cross section along III—III. Since the N type impurities of N type embedded layer 2 are diffused during epitaxial growth towards epitaxial grown layer 53 of high resistance and epitaxial grown layer 54 of low resistance located there above, the concentration distribution is exhibited as shown by distribution curve 82. Since phosphorus which is the impurity in epitaxial grown layer 54 of low resistance is diffused towards epitaxial grown layer 53 of high resistance, the concentration distribution is exhibited as a distribution curve 84. FIG. 4 shows the graph of the impurity concentration distribution taken along a cross section traversing the region where the embedded layer is not formed in FIG. 2, i.e. the cross section along IV—IV. Since only epitaxial grown layer 54 of low resistance has impurities included, the impurity concentration is exhibited as shown in a distribution curve 84.

Figure 5:
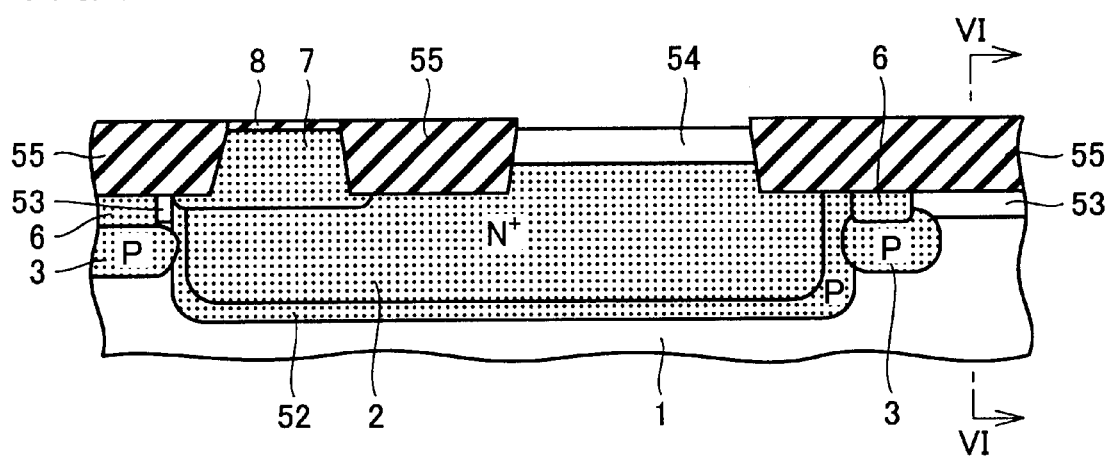
FIG. 5 shows a semiconductor device of the first embodiment to describe a third step of the fabrication method thereof.
Figure 6:
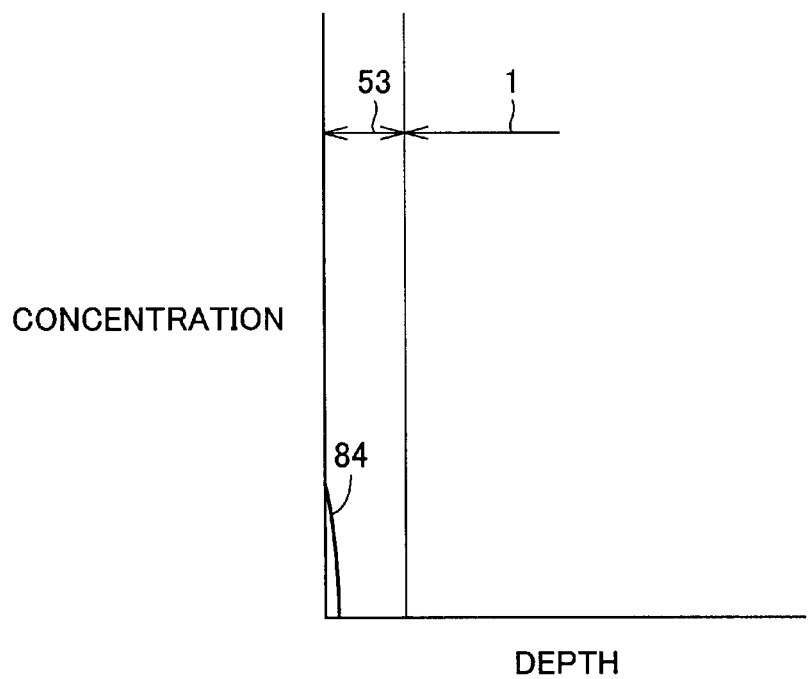
FIG. 6 is a graph showing the state where impurities diffused from the epitaxial grown layer of low resistance remain in the epitaxial grown layer of high resistance in the fabrication method of the semiconductor device of the first embodiment.

In order to remove the layer that contains phosphorus at this stage, etching is effected downwards from the surface to a total thickness of approximately 0.4 $\mu$m. This thickness of 0.4 $\mu$m takes into account the fact that phosphorus is also diffused into epitaxial grown layer 53 of high resistance during formation of epitaxial grown layer 54 of low resistance in addition to the 0.3 $\mu$m thickness of epitaxial grown layer 54 of low resistance. Thus, epitaxial grown layer 54 of low resistance corresponding to the region where a passive element is expected to be formed is etched away approximately 0.4 $\mu$m to carry out trench isolation. Specifically, an oxide film is formed by CVD (Chemical Vapor Deposition) in this state. The unrequired oxide film is etched by CMP (Chemical Mechanical Polishing) to form a trench oxide film 55 as shown in FIG. 5. Although there is a possibility of the impurities diffused from epitaxial grown layer 54 of low resistance partially remaining in epitaxial grown layer 53 of high resistance as indicated by a distribution curve 84 in FIG. 6, the effect of the remaining impurities is small if of a region formed at the diffusion of $5 \times 10^{16}/cm^3$ or below.

Figure 7:
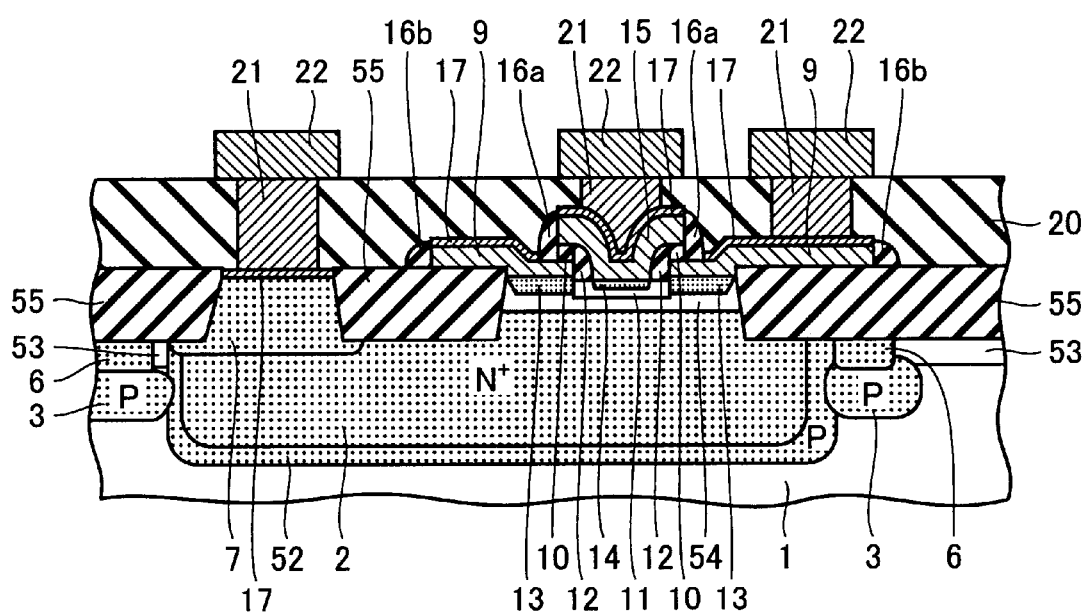
FIG. 7 shows the semiconductor device of the first embodiment to describe a fourth step of the fabrication method thereof.
Figure 25:
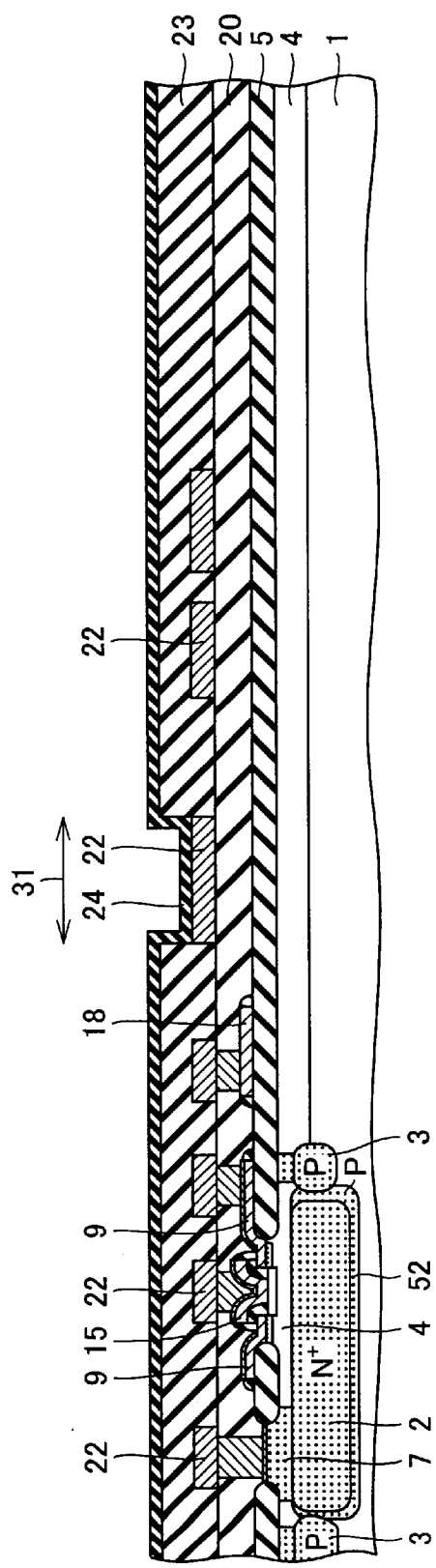

Then, a process similar to that described with reference to FIGS. 20–24 in the conventional art is carried out to form intrinsic base 11, external base 9, N type diffusion layer 14, emitter electrode 15, CoSi film 17, interlayer insulating film 20, contact plug 21, aluminium line 22 and the like. As a result, the structure shown in FIG. 7 is obtained. Then, steps similar to those described with reference to FIGS. 25 and 26 as prior art are carried out to respectively form interlayer insulating film 23, capacitor dielectric film 24, aluminium line 25 and nitride film 26. As a result, a structure as shown in FIG. 8 is obtained.

Figure 8:
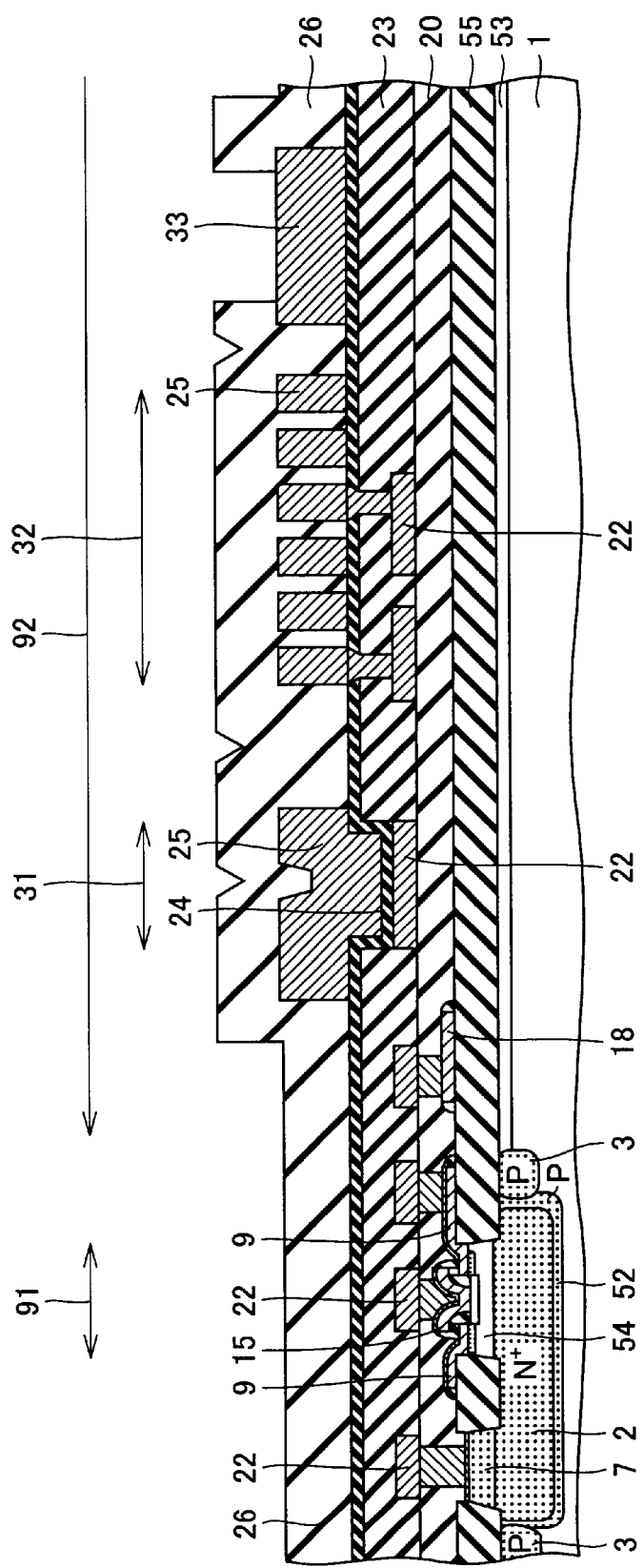
FIG. 8 is a sectional view of the semiconductor device of the first embodiment.

FIG. 8 corresponds to an example of a semiconductor device according to the first embodiment of the present invention. At the main surface of silicon substrate 1 that is a semiconductor substrate, a first region 61 where a bipolar transistor is to be disposed, and a second region 92 where a passive element and the like are to be disposed are defined in plane. The passive element includes MIM capacitor 31, inductor 32, pad 33, polysilicon resistor 18, and the like. On the main surface thereof, epitaxial grown layer 53 of high resistance is formed as the first layer, and epitaxial grown layer 54 of low resistance is formed thereon as the second layer. The second layer has a resistance lower than the resistance of the first layer. Epitaxial grown layer 54 of low resistance is disposed so as to cover first region 91 and avoid second region 92, which is the second layer.

By fabricating a semiconductor device of the above structure according to the above-described fabrication method, there will be no epitaxial grown layer of low resistance under the passive element. Therefore, the problem of a parasitic capacitance between the conductor portion of the passive element and the epitaxial grown layer of low resistance encountered in conventional cases can be eliminated.

In the example of FIG. 8, epitaxial grown layer 54 of low resistance is formed avoiding the region where the passive element is disposed. Even in the case where epitaxial grown layer 54 is formed so as to avoid only a portion instead of the entirety of the second region, the present invention is advantageous in that the parasitic capacitance can be reduced in proportion to the area of the portion where formation of epitaxial grown layer 54 of low resistance is avoided.

Figure 26:
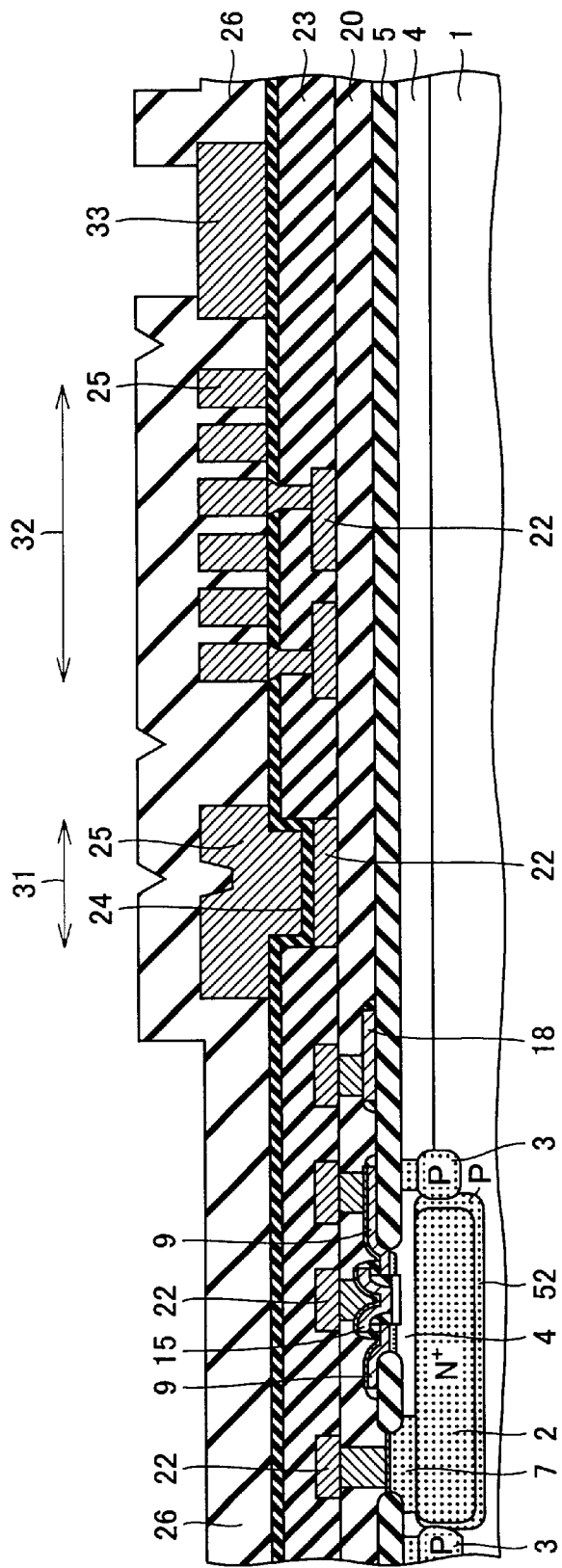
FIG. 26 is a sectional view of the conventional semiconductor device.

In the case where the epitaxial grown layer functioning as a collector layer is formed by only a single layer as in the conventional case shown in FIG. 26, the epitaxial grown layer becomes a unitary layer in which the resistance is entirely low. Regarding removal of this area to eliminate parasitic capacitance, a thickness of at least 0.9 µm must be removed if this layer has a thickness of 0.9 µm. This means that a distinct step will be generated. However, by taking a two-layered structure for the epitaxial grown layer, i.e., an epitaxial grown layer of low resistance and a epitaxial grown layer of high resistance, the thickness that must be removed to eliminate parasitic capacitance is merely slightly greater than the thickness of the epitaxial grown layer of low resistance. This means that the level of the distinct step generated can be suppressed.

Figure 9:
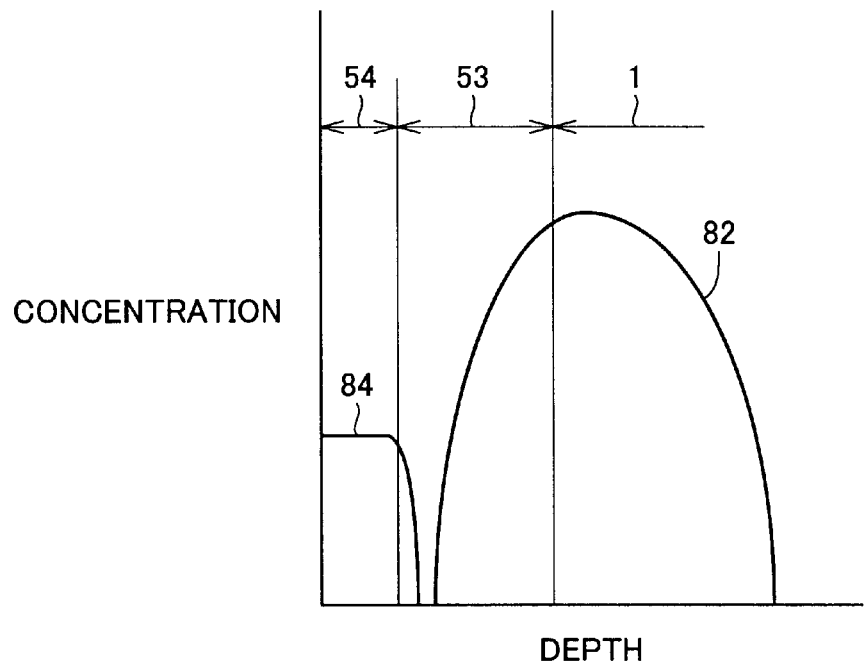
FIG. 9 is a graph of the impurity concentration distribution in a first region corresponding to the case where a thin epitaxial grown layer of low resistance is formed in the fabrication method of the semiconductor device of the first embodiment.
Figure 10:
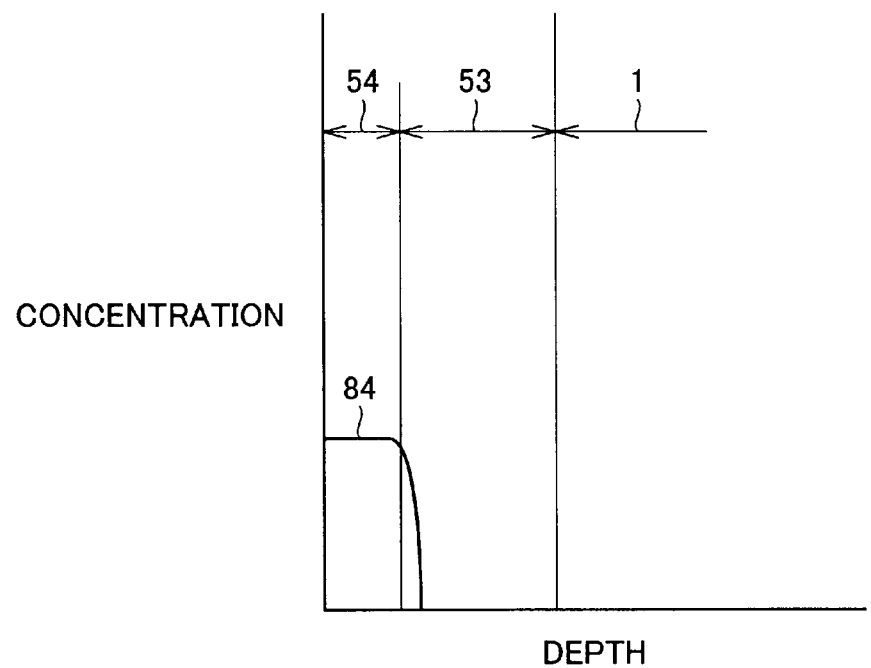
FIG. 10 is a graph of the impurity concentration distribution in a second region corresponding to the case where a thin epitaxial grown layer of low resistance is formed according to the fabrication method of the semiconductor device of the first embodiment.
Figure 11:
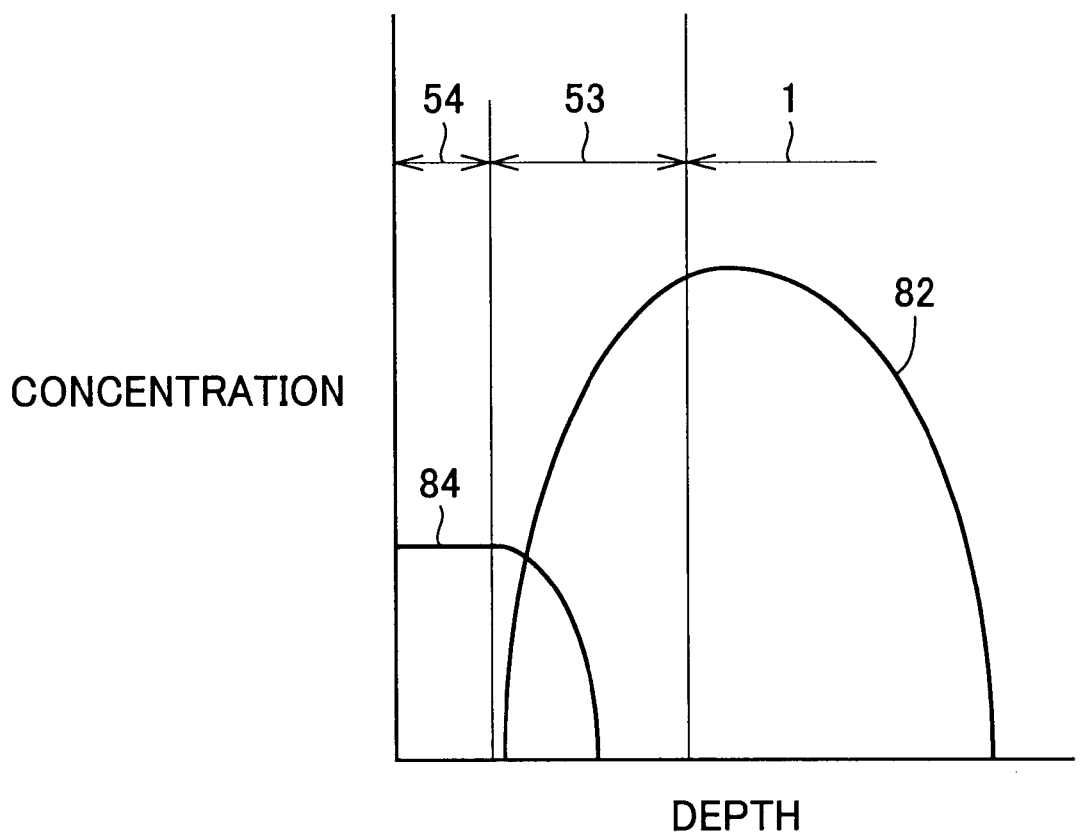
FIG. 11 is a graph of the impurity concentration distribution when impurities are diffused by thermal treatment according to the fabrication method of the semiconductor device of the first embodiment.
Figure 12:
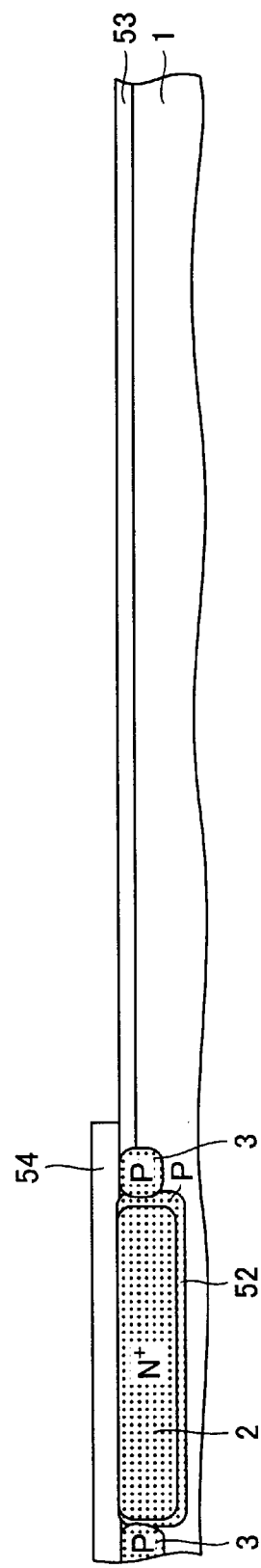
FIG. 12 is a diagram to describe a fabrication method of a semiconductor device according to a second embodiment of the present invention.

Epitaxial grown layer 54 of low resistance can be made thinner to reduce the distinct step. The impurity concentration distributions of first and second regions 91 and 92 corresponding to such a case are shown in FIGS. 9 and 10, respectively. Even if a state is achieved in which the distribution curve 82 of the N type impurities implanted into N type embedded layer 2 does not reach epitaxial grown layer 54 of low resistance as shown in FIG. 9 as a result of a thinner epitaxial grown layer 54 of low resistance, the appropriate annealing step carried out after formation of epitaxial grown layer 54 of low resistance or a thermal treatment carried out subsequently causes further diffusion of the impurities of distribution curves 84 and 82, as shown in FIG. 11, so that the distribution range join each other.

From the standpoint of reducing the stepped portion, a thinner epitaxial grown layer 54 of low resistance is preferable since the effect on the subsequent process becomes smaller. Since the distinct step should be reduced to be smaller than 0.5 µm taking into consideration subsequent steps, the thickness of epitaxial grown layer 54 of low resistance is preferably not more than 0.5 µm.

Formation of an epitaxial grown layer is generally carried out at the high temperature of at least 1000° C. If formation of epitaxial grown layer 54 of low resistance is carried out at a lower temperature of 700° C. or below, almost no phosphorus will be diffused towards epitaxial grown layer 53 of high resistance. This means that the amount to be etched to remove epitaxial grown layer 54 of low resistance and the portion including phosphorus diffused therefrom can be suppressed to a lower amount. Accordingly, the stepped portion generated by etching can be further reduced.

Second Embodiment

Figure 13:
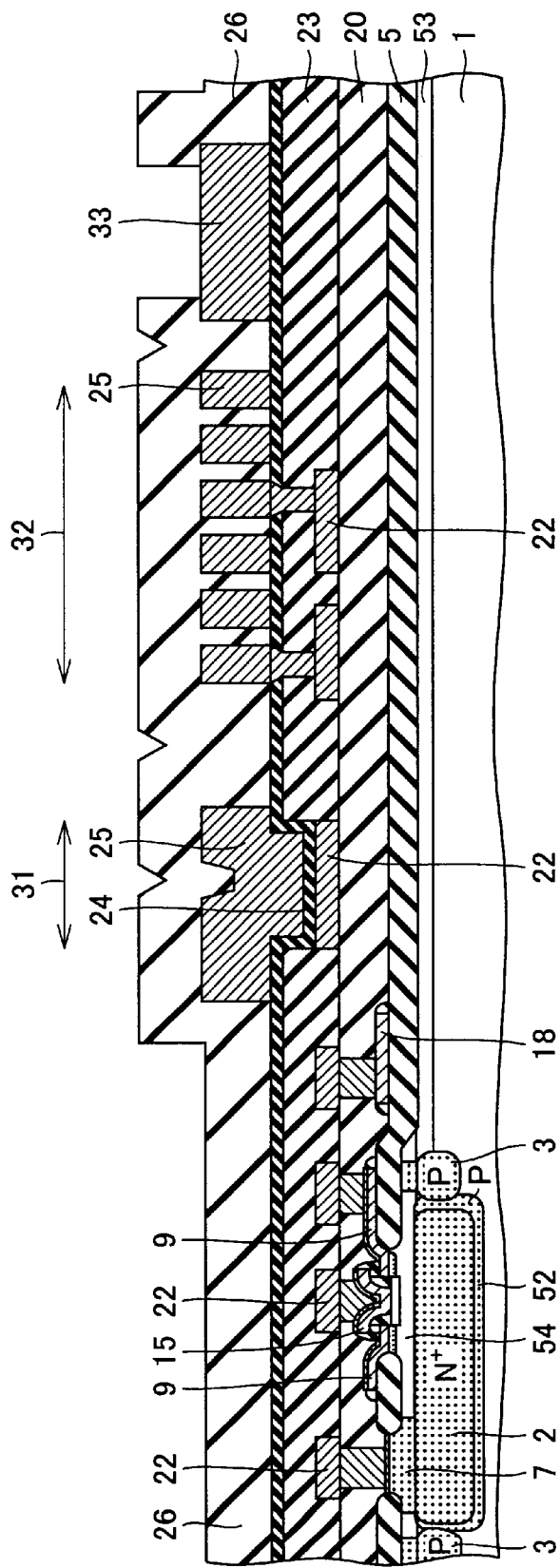
FIG. 13 is a sectional view of the semiconductor device of the second embodiment.

A method of fabricating a semiconductor device according to a second embodiment of the present invention will be described here. Likewise the steps described in the previous first embodiment with reference to FIGS. 1 and 2, epitaxial grown layer 54 of low resistance is formed. Epitaxial grown layer 54 of low resistance in the region where a passive element is to be arranged is removed by etching. Then, LOCOS is effected likewise the process carried out in the conventional art with reference to FIGS. 17–20 to form field oxide film 5. Furthermore, a process similar to that shown in the conventional art is carried out to form other components, resulting in the structure of FIG. 13.

By the fabrication method of the second embodiment, the problem of parasitic capacitance caused by epitaxial grown layer 54 of low resistance can be solved while the distinct step reduction advantage will be degraded.

Third Embodiment

Figure 14:
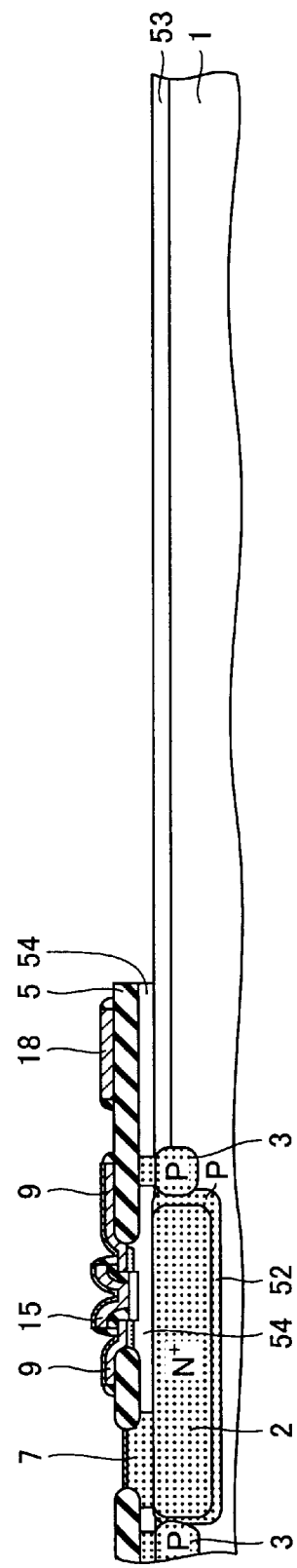
FIG. 14 is a diagram to describe a fabrication method of semiconductor device according to a third embodiment of the present invention.
Figure 15:
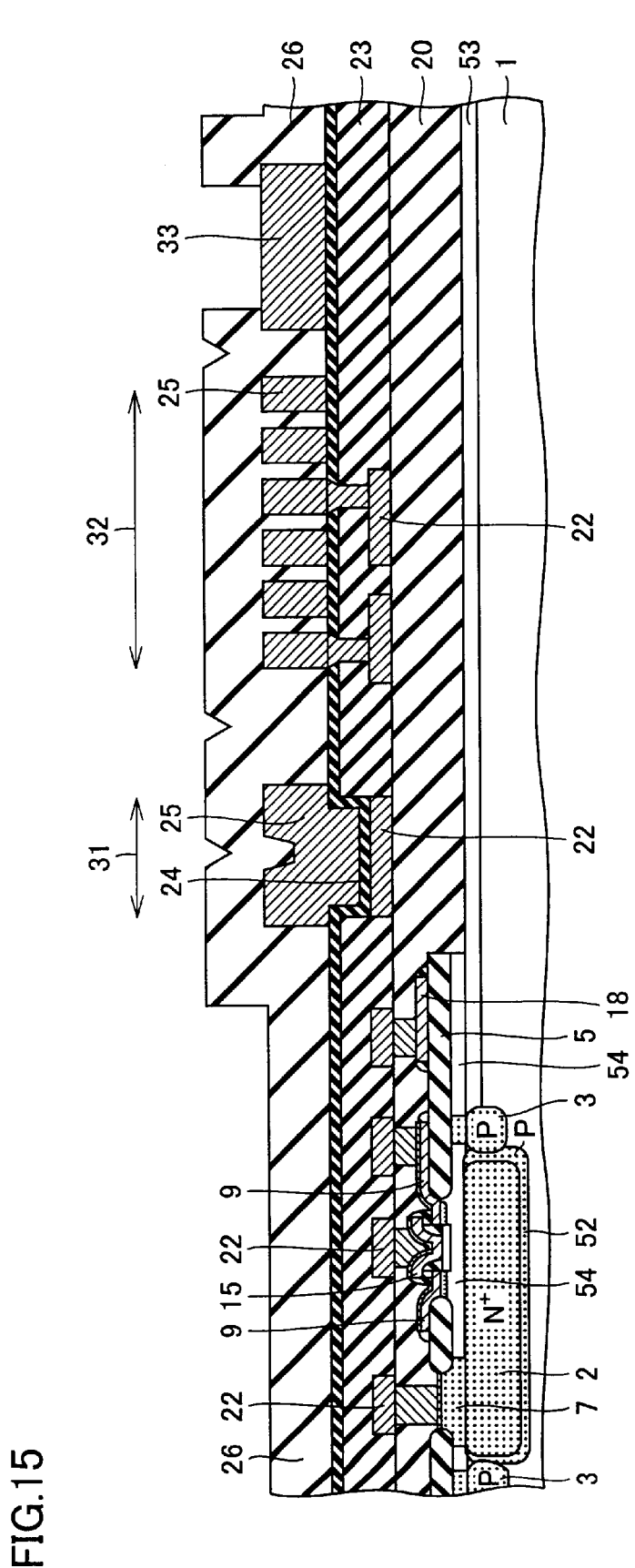
FIG. 15 is a sectional view of the semiconductor device of the third embodiment.
Figure 16:
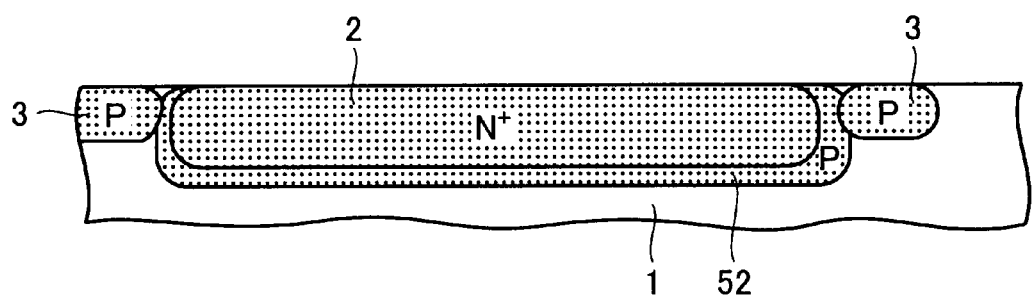
FIGS. 16 and 17 show a semiconductor device according to conventional art to describe a first step and a second step, respectively, of a fabrication method thereof.
Figure 17:
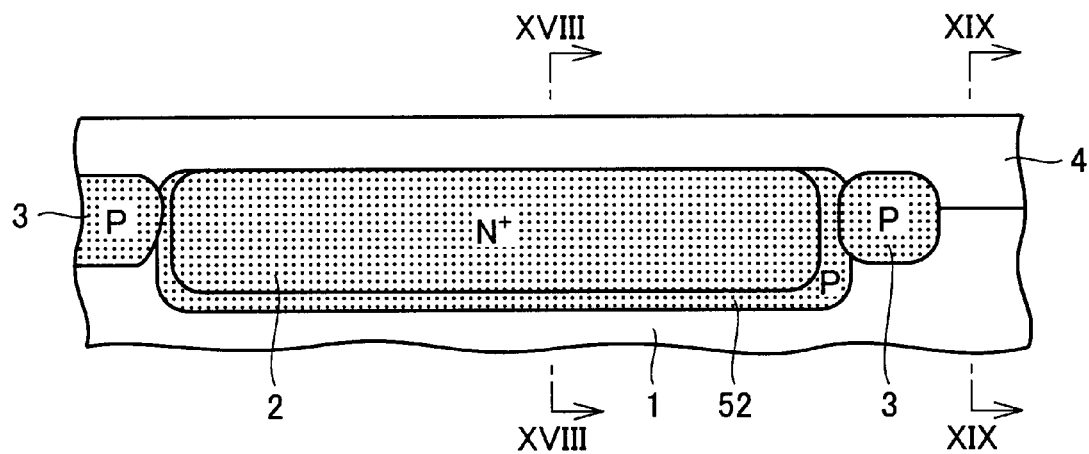
Figure 18:
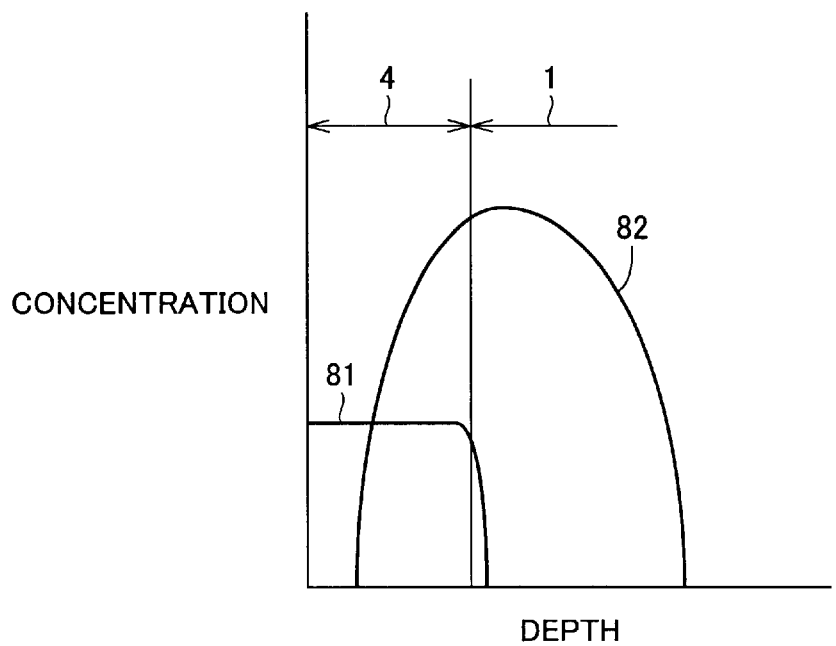
FIGS. 18 and 19 are graphs showing the impurity concentration distribution taken along cross sections of XVIII—XVIII and XIX—XIX, respectively, of FIG. 17.
Figure 19:
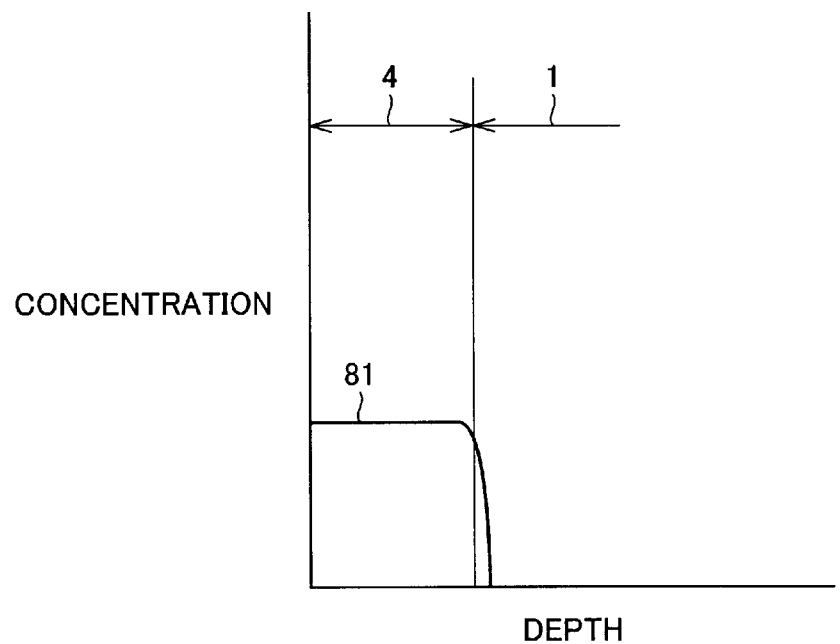
Figure 20:
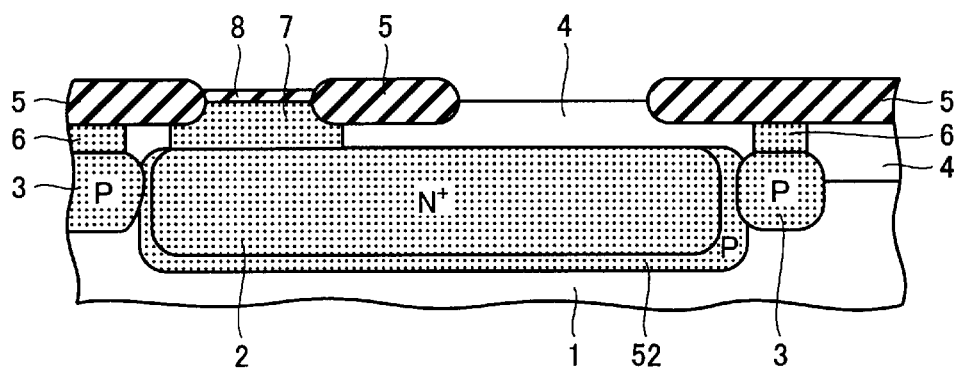
FIGS. 20, 21, 22, 23, 24 and 25 show the semiconductor device of the conventional art to describe a third step, a fourth step, a fifth step, a sixth step, a seventh step and an eighth step, respectively, of the fabrication method thereof.
Figure 21:
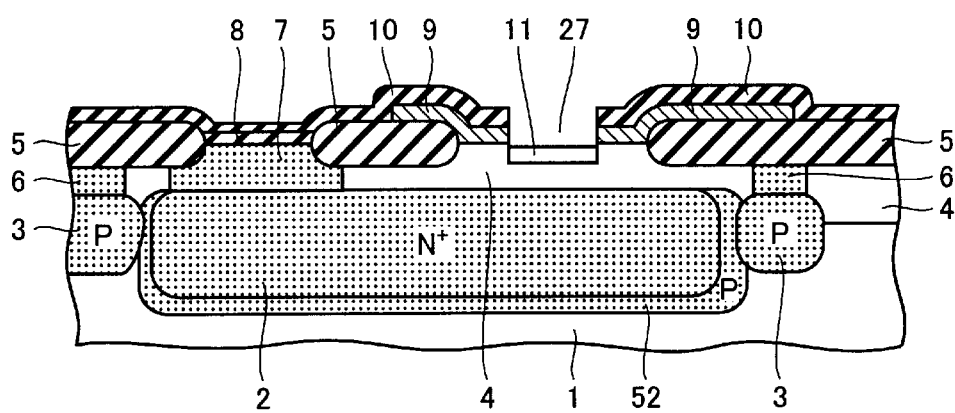
Figure 22:
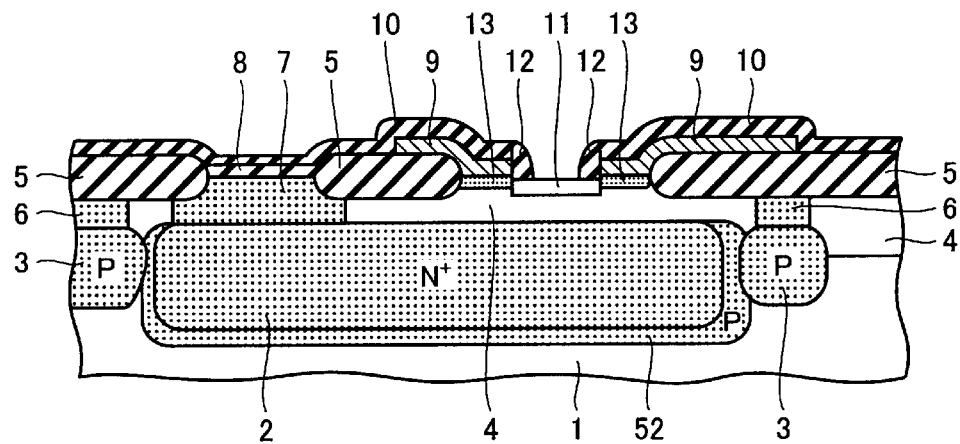
Figure 23:
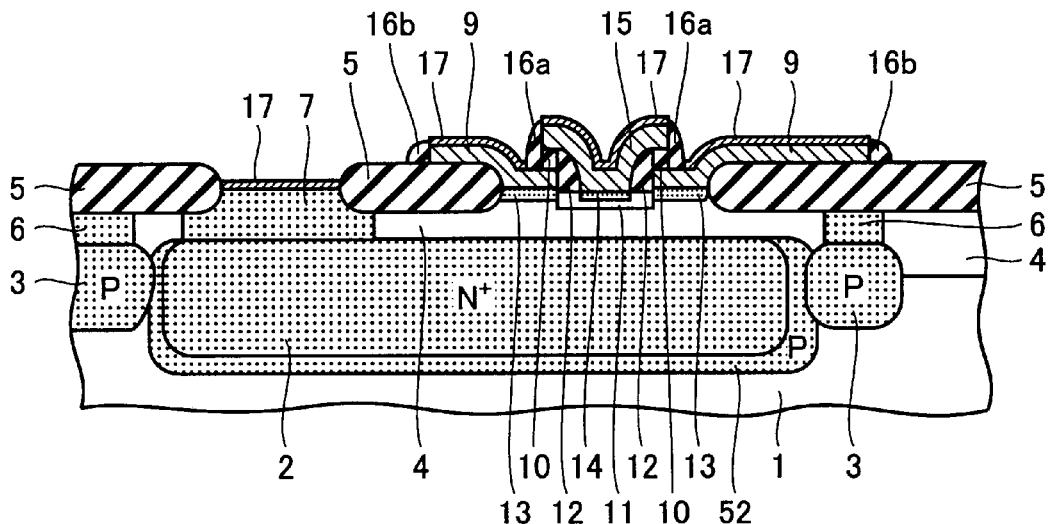
Figure 24:
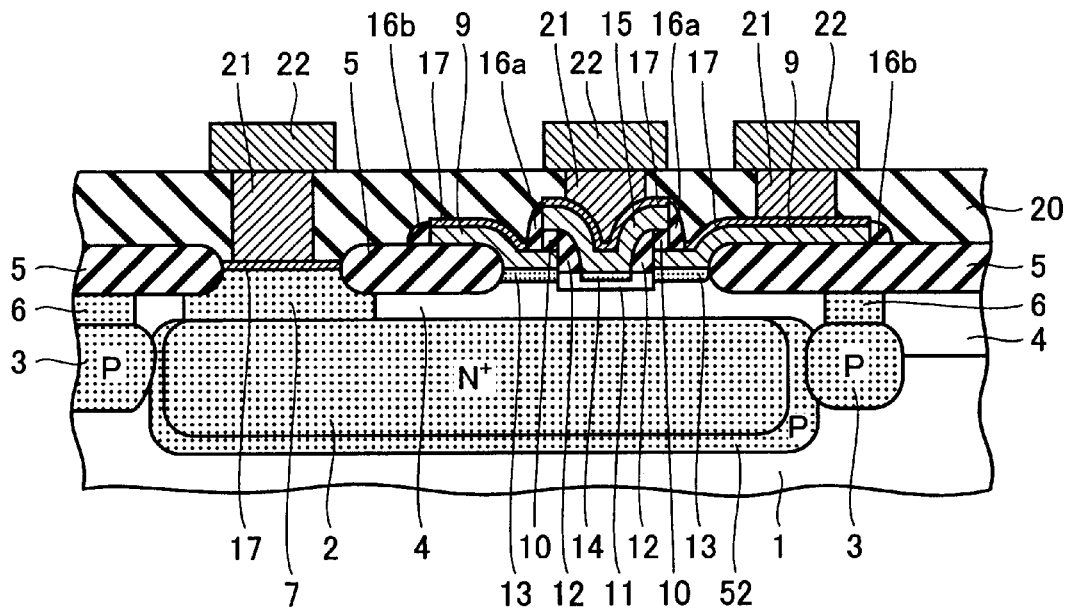

A method of the fabricating semiconductor device according to a third embodiment of the present invention will be described here. Likewise the process described in the previous first embodiment with reference to FIGS. 1 and 2, epitaxial grown layer 54 of low resistance is formed. LOCOS is carried out similar to the process carried out as shown in FIG. 20 in the conventional art to form field oxide film 5. Then, a process similar to that shown in FIGS. 21–23 in the conventional art is carried out. Following formation of the bipolar transistor and peripheral wiring, field oxide film 5 and epitaxial grown layer 54 of low resistance are removed by etching from regions including at least a portion of the region where the passive element is to be arranged, as shown in FIG. 14. It is to be noted that polysilicon resistor 18 included in the passive element is not removed and remains. The passive element may be partially left in this manner depending upon the circumstance. Then, a process similar to that described in the section of the background art is carried out to form other components, resulting in the structure of FIG. 15.

Since a structure absent of a epitaxial grown layer 54 of low resistance below the passive elements can be obtained according to the fabrication method of the third embodiment, the problem of parasitic capacitance caused by epitaxial grown layer 54 of low resistance can be eliminated. The stepped portion generated by the etching step of epitaxial grown layer 54 of low resistance may seem to be greater than that generated by the conventional art since filed oxide film 5 is together etched away. However, interlayer insulating film 20 is formed thereafter at the generated stepped portion. By the planarization step, the stepped portion is generally of no concern.

In each of the above embodiments, loss can be suppressed if the resistance of the silicon substrate is at least 10 Ω·cm. Loss by the silicon substrate can be further suppressed by a higher resistance. It is therefore desirable to select the resistance of at least 1 k Ω·cm for the silicon substrate in the present invention. To date, silicon having such a high resistance and that is mechanically and electrically stable even after undergoing the general silicon process has not been yet produced in large quantities. In practice, usage of a silicon substrate of at least 100 Ω·cm is effective in practice. By using a silicon substrate having the resistance of 100 Ω·cm with respect to a silicon substrate having the general resistance of 10.0 Ω·cm, the loss can be suppressed to approximately 1/10. Likewise, it is desirable to use epitaxial grown layer 53 of high resistance having a resistance of at least 100 Ω·cm.

Figure 27:
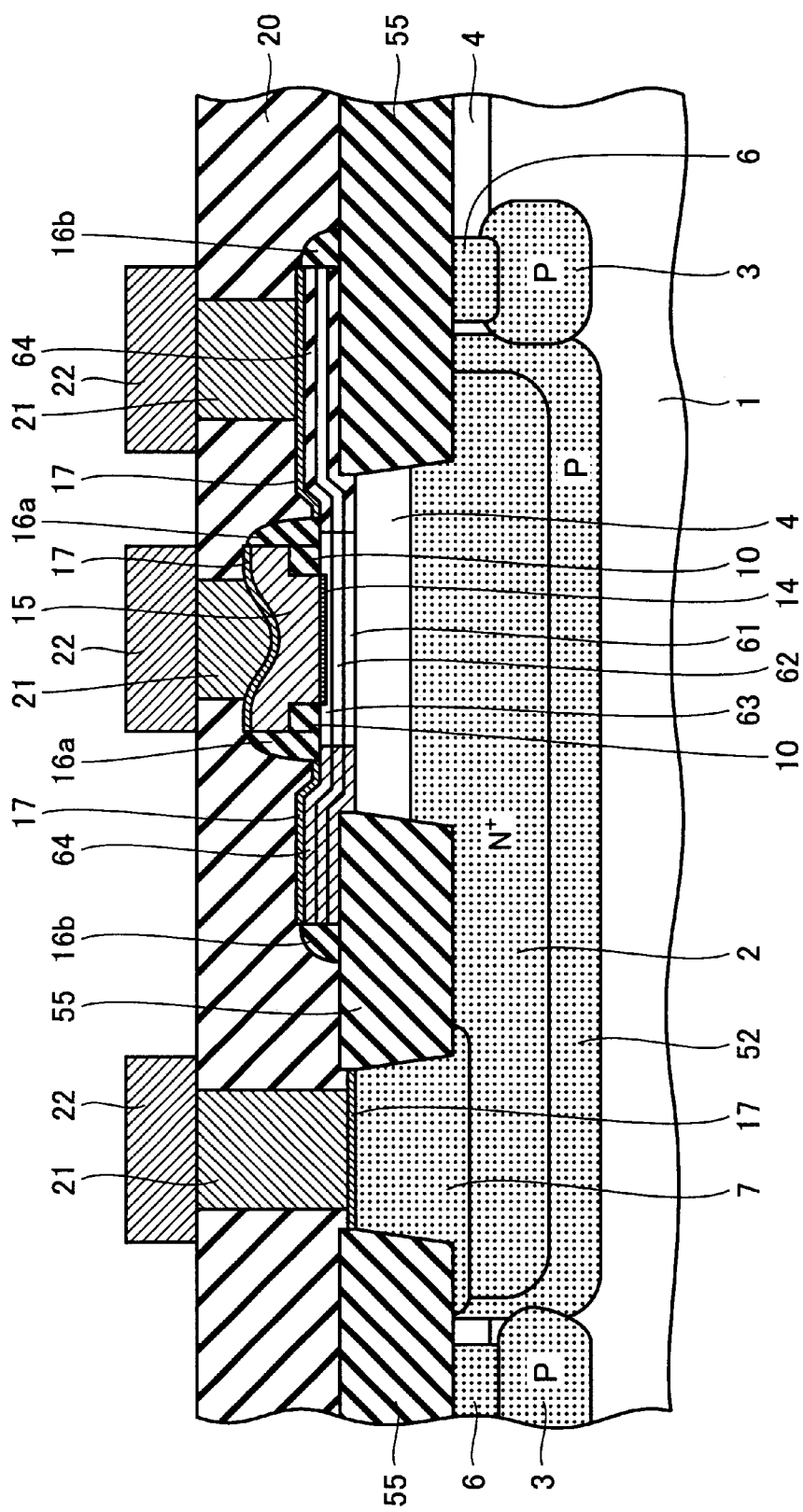
FIG. 27 is a sectional view of another conventional semiconductor device.
Figure 28:
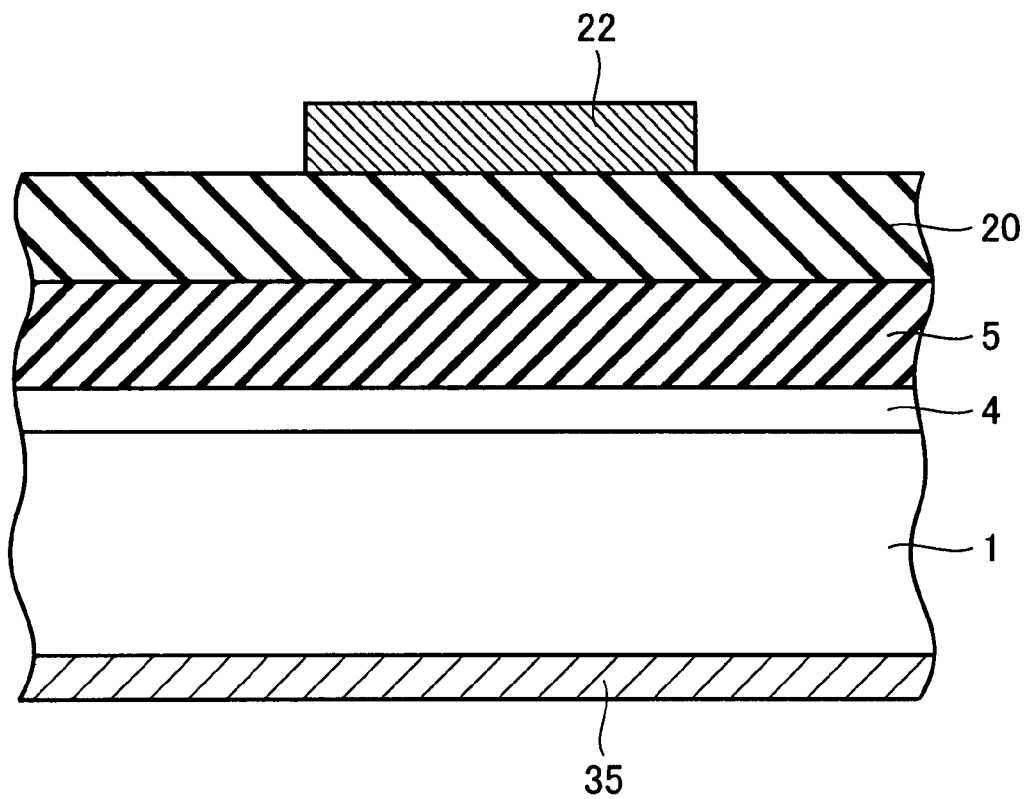
FIG. 28 is a simplified sectional view of a structure of a passive element region.
Figure 29:
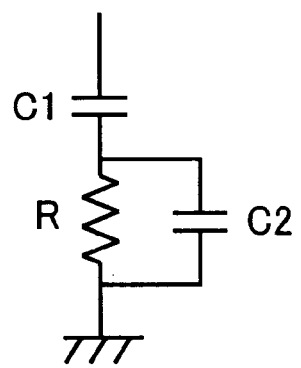
FIG. 29 is a simplified equivalent circuit diagram corresponding to FIG. 28.

Each of the above embodiments is described in which a bipolar transistor of homojunction is employed. However, the present invention is also applicable to a bipolar transistor of hetero junction as shown in FIG. 27, i.e., applicable to SiGe-HBT. It is to be noted that SiGe-HBT is capable of high speed operation, and the effect of parasitic capacitance is great in high speed operation. Therefore, by reducing the parasitic capacitance according to the present invention, a greater advantage can be derived.

According to the present invention, the parasitic capacitance at the region where the passive element is arranged can be reduced since the presence of a second layer of low resistance under the passive element in the second region can be prevented. Also, by adjusting the ratio of the thickness between first and second layers, the stepped portion generated by the presence/absense of the second layer can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:

a semiconductor substrate having a main surface including first and second regions side-by-side at said main surface;

a first epitaxial semiconductor layer in each of said first and second regions and having a resistivity;

a second epitaxial semiconductor layer on said first epitaxial semiconductor layer opposite from said main surface, and having a resistivity lower than the resistivity of said first epitaxial semiconductor layer; and a bipolar transistor at said first region and a passive element at said second region, said second epitaxial semiconductor layer being present in said first region but being absent from said second region.

2. The semiconductor device according to claim 1, wherein said semiconductor substrate has a resistivity of at least 100 Ω cm and said first epitaxial semiconductor layer has a resistivity of at least 100 Ω cm.

3. The semiconductor device according to claim 1, wherein said second epitaxial semiconductor layer has a thickness not more than 0.5 µm.

* * * * *